United States Patent [19]
Montijo

[11] Patent Number: 6,052,107
[45] Date of Patent: Apr. 18, 2000

[54] METHOD AND APPARATUS FOR DISPLAYING GRATICULE WINDOW DATA ON A COMPUTER SCREEN

[75] Inventor: B. Allen Montijo, Colorado Springs, Colo.

[73] Assignee: Hewlett-Packard Company, Palo Alto, Calif.

[21] Appl. No.: 08/878,430

[22] Filed: Jun. 18, 1997

[51] Int. Cl.[7] .................................................. G09G 5/36
[52] U.S. Cl. .......................................... 345/134; 345/327
[58] Field of Search .................................... 345/134, 501, 345/422; 395/157, 113, 115, 327

[56] References Cited

U.S. PATENT DOCUMENTS

| | | | |
|---|---|---|---|
| 4,104,624 | 8/1978 | Hamada | 340/324 |
| 4,829,293 | 5/1989 | Schlater | 340/722 |
| 4,940,931 | 7/1990 | Katayama et al. | 324/121 |
| 4,992,961 | 2/1991 | Petersen | 364/521 |
| 5,028,914 | 7/1991 | Povenmire | 340/720 |
| 5,146,592 | 9/1992 | Pfeiffer et al. | 395/157 |
| 5,838,334 | 11/1998 | Dye | 345/503 |

*Primary Examiner*—Amare Mengistu
*Assistant Examiner*—Vanel Frenel

[57] ABSTRACT

A method of displaying graticule window data on a computer screen is disclosed herein. The method generally commences as graticule window data (e.g., live signal traces, graticule lines, etc.) is written into a video random-access memory, and conventional display data is written into a display buffer. In response to synchronization signals, the conventional display data is read from the display buffer, and the graticule window data is converted into video data. Also in response to synchronization signals, and further in response to reading conventional display data matching a reference color, the video data is multiplexed with the conventional display data to create a video output. The video output is then used to illuminate the pixels of a computer screen. Computer apparatus for executing the method's steps is also disclosed.

20 Claims, 5 Drawing Sheets

METHOD AND APPARATUS FOR DISPLAYING GRATICULE WINDOW DATA ON A COMPUTER SCREEN

FIELD OF THE INVENTION

The invention pertains to the display of graticule window data (e.g., signal traces and graticule lines) by instruments such as oscilloscopes, spectrum analyzers, network analyzers, and the like. More particularly, the invention pertains to the display of live signal traces requiring a high update rate. Instruments capable of displaying these traces are more likely to capture brief signal anomalies and provide timely feedback of same to a user.

BACKGROUND OF THE INVENTION

With increasing frequency, waveform instruments are depending on computers to plot and display signal traces. For cost and time-to-market reasons, it is often desirable to use off-the-shelf components for the microprocessor, display controller, and/or operating system of such an instrument. Examples of such components are PC motherboards, PC display cards, PC display controllers, Windows® 3.1, Windows® 95, Windows® NT®, and UNIX®. These components are typically optimized for a windowed environment, and are not optimized to display the types of "live" traces which need to be displayed by a waveform instrument.

Generally, PCs and computer workstations incur a great deal of overhead when plotting data, especially in a windowed display environment. For example, typical Personal Computer (PC) formats for display data are index and RGB (Red, Green, Blue). Each of these data formats consists of a single piece of information—the color intensity of a pixel (picture element) to be illuminated by a CRT (cathode ray tube). When updating display data, old data values must be read so that new data may be combined with it (i.e., read-modify-write operations are used to maintain a single piece of information). As a result, a pixel's entire data field (often a 16-bit field) is constantly changing.

A windowed display further complicates the problem. In a windowed environment, anytime a trace is plotted or updated, an operating system needs to determine which parts of the trace should be visible (i.e., not obscured by another window). This adds even further to the already high overhead associated with using the standard display path of a PC or workstation to plot signal traces.

In an oscilloscope, data is typically organized in a number of fields so that numerous pieces of information may be 1) simultaneous maintained, and 2) individually updated. For example, pixel data for an oscilloscope might comprise a 16-bit data word with four 1-bit fields representing "markers", "memories", "highlight" and "graticule", and four 3-bit fields representing the intensity levels (including OFF) of four different signal traces. Conventional oscilloscopes are designed to efficiently plot this sort of data. However, PCs and workstations require that this non-standard data be converted to a conventional form, such as RGB or index. Since the standard display path of a PC or workstation is already slow (in comparison to the display path of a conventional oscilloscope), incurring this additional processing overhead makes it nearly impossible to achieve a high update rate for the display of live signal traces on a computer screen.

Hewlett-Packard Company produces oscilloscopes, signal acquisition boards, and the like that offer a variety of display modes. Three of these modes are "grey-scale variable persistence" mode, "minimum persistence" mode, and "infinite persistence" mode. Each of these modes uses a 16-bit data format similar to that described in the previous paragraph. As a result, each mode requires a lot of processing bandwidth, and it is prohibitive to optimally implement these modes using the standard display path of a PC or workstation. Calls to the operating systems generate too much overhead.

A number of hardware-assisted plotting devices (i.e., display accelerators) are currently available on the market. However, none of these devices are optimized to draw and update live signal traces.

Since prior computerized waveform instruments have always processed graticule window data through the "standard display path", their performance has suffered greatly.

It is therefore a primary object of this invention to provide a high-throughput display of live signal traces on a computer screen, via a method which does not require a wholesale upgrade of an existing computer system (e.g., a faster processor, faster memory, the addition of a video accelerator card, etc.). Upgrading is expensive, and if a system is already using the highest performance components available, upgrading may not even be feasible.

It is a further object of this invention to provide for the efficient update of live signal traces, without interfering with the normal functionality provided by a computer's operating system. For example, if a live signal trace is being displayed in a first window, another application should be able to put up a second window on top of the first, without the second window interfering with the display of the live trace, and without the first window interfering with the operating system's ability to timely display the second window.

Another object of this invention is to provide a method wherein low-speed information which is intended to dominate over live signal data, such as measurement text, can be added to a display via the standard display path used by a PC or workstation's operating system.

SUMMARY OF THE INVENTION

Many display controllers have an I/O port, variously referred to as a "Feature Connector", "VAFC" (VESA (Video Electronic Standards Association) Advanced Feature Connector), "PC Video Port", or a "Zoom/Video Port". Other display controllers have, or can interact with, an I/O port referred to as a "VMC" (VESA Media Channel). Still other display controllers have an I/O port which receives video data from a system bus, such as a PCI (Peripheral Component Interconnect) local bus. These various I/O ports of a display controller will be collectively referred to herein as "video ports".

In the achievement of the foregoing objects, the inventor uses a display controller's video port to provide live signal trace data to a display controller. More particularly, graticule window data, including signal trace data, is stored in a secondary display buffer which is independent of the standard display buffer. The secondary display buffer is maintained with a data format and supporting hardware and software which efficiently implement the plotting of live signal traces. Specifically, the secondary display buffer (sometimes referred to herein as a "graticule window generator") comprises video random-access memory (VRAM) wherein graticule window data is stored in an easily updated form (e.g., 16 bits with various fields for plotting traces, graticule lines, markers, etc.). Since VRAM allows for bit-wise masking, and the plotting of data via write-only operations, an update of a single displayed trace only requires, for example, that the bits of a 3-bit field be modified. Note that there is no need to read the entire 16-bit data field (or even the 3-bit field) prior to writing new data into it. Data stored in VRAM may then be converted into an accepted video format, via hardware, prior to being input through a display controller's video port. Finally, graticule window data is multiplexed with conventional display data in response to conventional display data which matches a reference color (and in most cases, in response to a video enable signal). In this manner, information not associated with the display of signal traces is generally displayed via the standard display path. For example, low-speed information (e.g., measurement text) can be painted into the substitution area via the standard display path and conventional operating system calls. As long as the text is not the same color as the reference color, the text will dominate over the live trace data in these pixels.

These and other important advantages and objectives of the present invention will be further explained in, or will become apparent from, the accompanying description, drawings and claims.

BRIEF DESCRIPTION OF THE DRAWINGS

An illustrative and presently preferred embodiment of the invention is illustrated in the drawings in which.

DESCRIPTION OF THE PREFERRED EMBODIMENT

Figure 1:
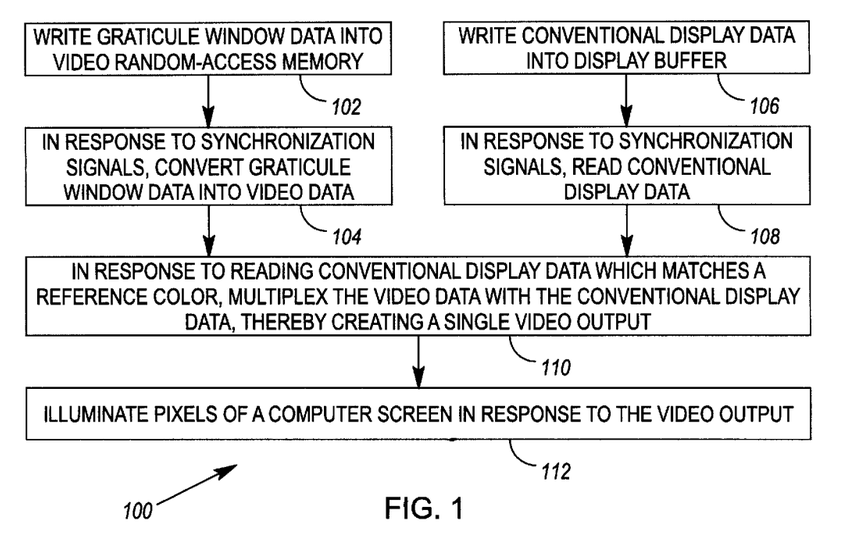
FIG. 1 illustrates a method of displaying graticule window data on a computer screen.

A method 100 of displaying graticule window data on a computer screen is illustrated in FIG. 1, and may generally commence with the steps of writing graticule window data into a video random-access memory 102, and writing conventional display data into a display buffer 106. In response to synchronization signals, the conventional display data is read from the display buffer 108, and the graticule window data is converted into video data 104. Also in response to synchronization signals, and further in response to reading conventional display data matching a reference color (and in most cases, in response to a video enable signal), the video data is multiplexed with the conventional display data to create a video output 110. Either directly or indirectly, the video output may be used to illuminate the pixels of a computer screen 112.

The above method 100 serves as the basis for configuring a computerized waveform instrument 400 (FIG. 4) capable of providing a high update rate for the display of live signal traces, waveforms, and the like. Such an instrument 400 may generally comprise a processor 202 (FIG. 5), a primary display buffer 214, a video port 224, a secondary display buffer 604 (FIG. 6), an operating system, and application software. All of these elements can be coupled so that the application software initializes hardware to 1) read graticule window data, including signal trace data, from the secondary display buffer 604, 2) convert the graticule window data read from the secondary display buffer 604 into video data, 3) input the video data through the video port 224, and 4) load all other display data into the primary display buffer 214.

The above method 100 also serves as the basis for configuring a general purpose computer which is capable of rapidly storing, updating and displaying graticule window data. Such a computer may generally comprise a display controller 212 with a video port 224, a display buffer 214 coupled to the display controller 212, and a graticule window generator 504 connected to the video port 224. In operation, the display controller 212 multiplexes data received from both the display buffer 214 and the graticule window generator 504 so as to generate a video output 226. The graticule window generator 504 (FIG. 6) may generally comprise a video random-access memory 604, controller means 614 for writing graticule window data into various bits and planes of the video random-access memory 604, and encoding means 606 for converting various planes of the stored graticule window data into video data 622.

Having generally described a method 100 of displaying waveform data on a computer screen, and computer apparatus 400, 500, 504 for implementing same, the method 100 and apparatus 400, 500, 504 will now be described in further detail.

As used both in this description, and the appended claims, "connected" implies a direct connection between two components, and "coupled" implies either a direct or indirect connection (i.e., an interconnection via other components) between two components.

Since the methods described herein are designed to be executed by a computer (i.e., a general purpose computer or a computerized waveform instrument 400), an exemplary host computer (primarily a computer motherboard) is described below. The host computer 200 (FIG. 2) comprises a processor 202, an L2 (secondary level) cache controller 204, L2 cache SRAM (static random-access memory) 206, a system memory controller 208, system DRAM (dynamic random-access memory) 210, a display controller 212, a display buffer 214, and a system bus 216. The processor 202 may comprise an internal cache, and may fetch/store instructions/data from its internal cache, the L2 cache SRAM 206, or the system DRAM 210. The system bus 216 connects the display controller 212 and other peripheral devices 218, 220 to the L2 cache and system memory controllers 204, 208, and is itself controlled by the processor 202. The display buffer 214 is connected to the display controller 212, but could alternately comprise a dedicated portion of the system DRAM 210.

Figure 2:
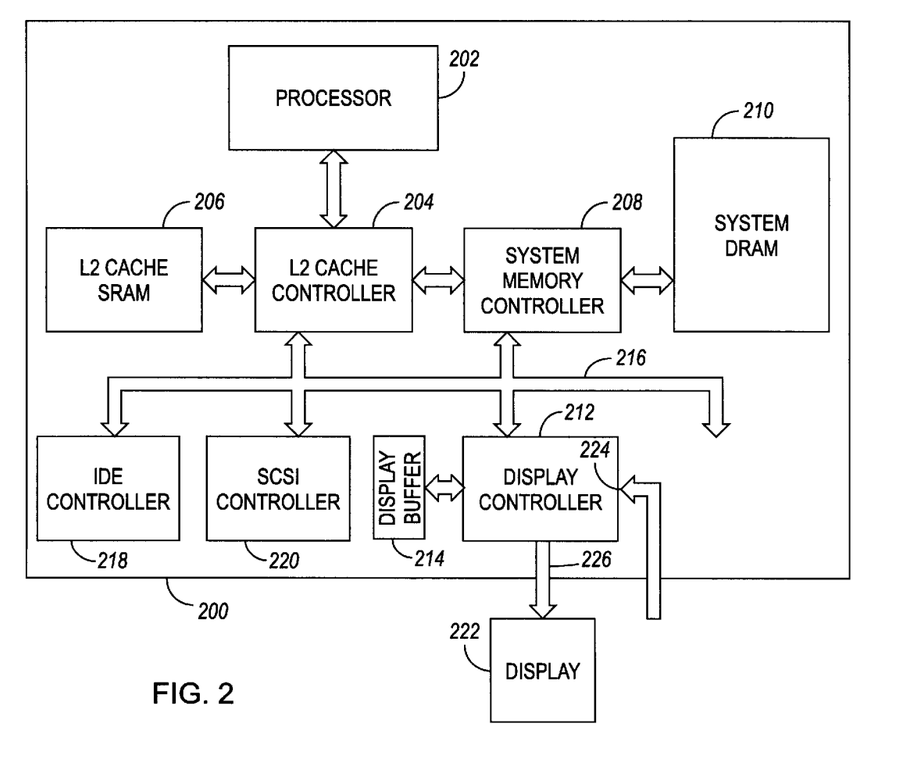
FIG. 2 is a schematic of an exemplary host computer in which the method of FIG. 1 might be executed.

A computer motherboard embodying characteristics of the host computer 200 shown and described herein is marketed by AMI under the name Atlas PCI-II. The processor 202 on the AMI motherboard is an AMD-K5 processor, and the system bus 216 is a PCI (peripheral components interconnect) bus. Various peripheral devices which might be connected to the PCI bus 216 include an EIDE (enhanced integrated device electronics) controller 218 and a SCSI (small computer systems interface) controller 220.

The host computer 200 is connected to a display 222 (sometimes referred to herein as a "computer screen") via the display controller 212.

A computer as shown and described is of little use without an operating system. An operating system may be stored in system DRAM 210, and among other things, instructs the processor to 1) load data into the display buffer 214, and 2) transfer data from the display buffer 214 to the display controller 212.

Most operating systems in use today instruct a computer to display windows of information. An example of such an operating system is the Microsoft® Windows® 95 operating system. Other commonly used "windowed" operating systems include Windows® 3.1, Windows® NT®, and UNIX®.

Figure 3:
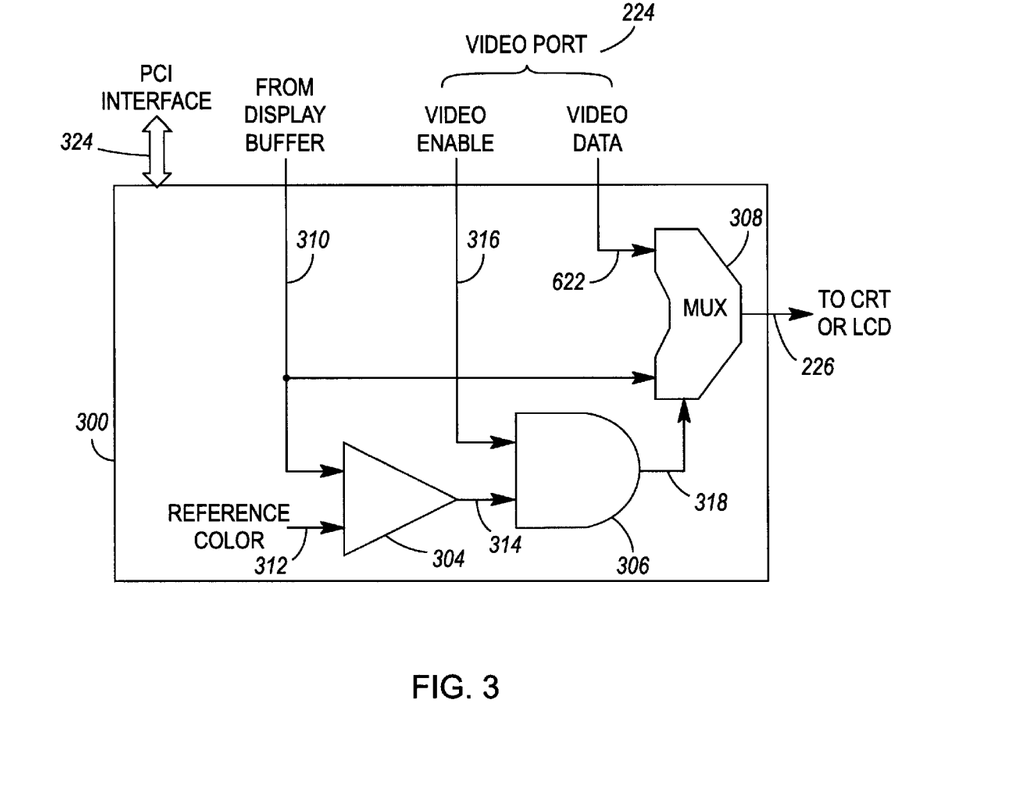
FIG. 3 is a schematic of various display controller components found in the display controllers of FIGS. 2 and 5.

Various components of the FIG. 2 display controller 212 are shown in greater detail in FIG. 3. As is often the case in modern day computer systems, the display controller 212 comprises a video port 224. The purpose of this port is to allow a computer to display externally generated video images, generally from a tuner or CD-ROM (compact disc read only memory). The FIG. 3 illustration 300 comprises three components—a comparator 304, an external video enable gate 306, and a multiplexer 308. The output of the multiplexer 308 is a video output stream 226 which can be used to illuminate the pixels of a computer screen 222. A commercially available display controller 212 meeting the above specifications is the Chips & Technologies F65550 display chip.

In operation, conventional display data 310 obtained from the display buffer 214 is provided to inputs of the comparator 304 and multiplexer 308. The comparator 304 also receives a reference color input 312. When data 310 obtained from the display buffer 214 matches the reference color 312, the output 314 of the comparator 304 is asserted. The external video enable gate 306 receives both a video enable signal 316 and the output 314 of the comparator 304. When both of its inputs are asserted, the enable gate 306 asserts its own output 318. The output 318 of the enable gate 306 provides the control for the multiplexer 308. If the output 318 of the enable gate 306 is asserted, video data 622 received through the video port 224 is output from the multiplexer 308. Otherwise, data 310 from the display buffer 214 is output from the multiplexer 308.

Data stored in the display buffer 214 is initially sourced over the PCI bus 216, retrieved by the display controller 212 via a PCI interface 324, and written into the display buffer 214. Various synchronization signals (horizontal and vertical syncs, clock(s), etc.) 618 (FIG. 6) are generated by the display controller 212.

The display controller 212 outputs a video stream 226 to either a CRT, flat panel display (e.g., an LCD), or both. While a CRT is capable of higher resolution, LCD displays are advantageous in some situations in that they require less physical space.

With the above system, a window or other defined area may be filled by an externally generated video image.

Unfortunately, a system such as that which is described above is not optimized to display the kind of live signal traces displayed by oscilloscopes, spectrum analyzers, network analyzers, and the like. All of these "waveform instruments" require a high update rate for the storage and display of data. However, this problem may be solved by adapting the above mentioned host computer 200 to display graticule window data. The computerized waveform instrument 400 of FIG. 4 illustrates a preferred embodiment of such an adaptation.

Graticule window data, as defined herein, comprises live signal traces, graticule lines, and other information which is normally displayed within a graticule window. Graticule window data may also comprise any display data which is provided to a display controller 212 via the methods described herein.

Figure 4:
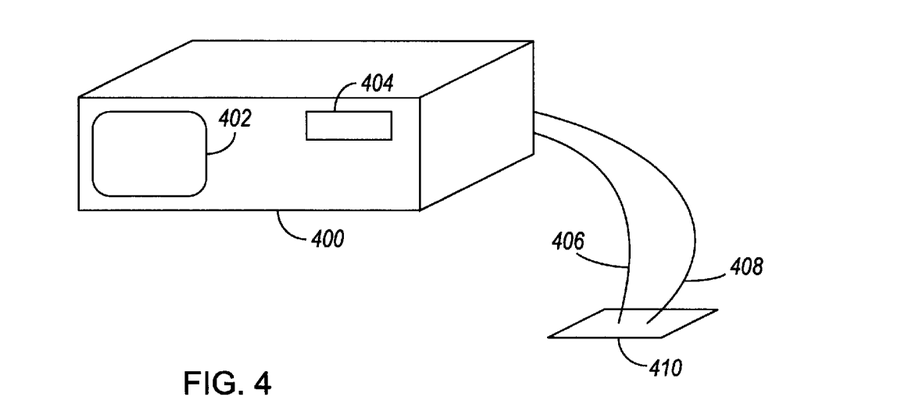
FIG. 4 illustrates a computerized waveform instrument.
Figure 5:
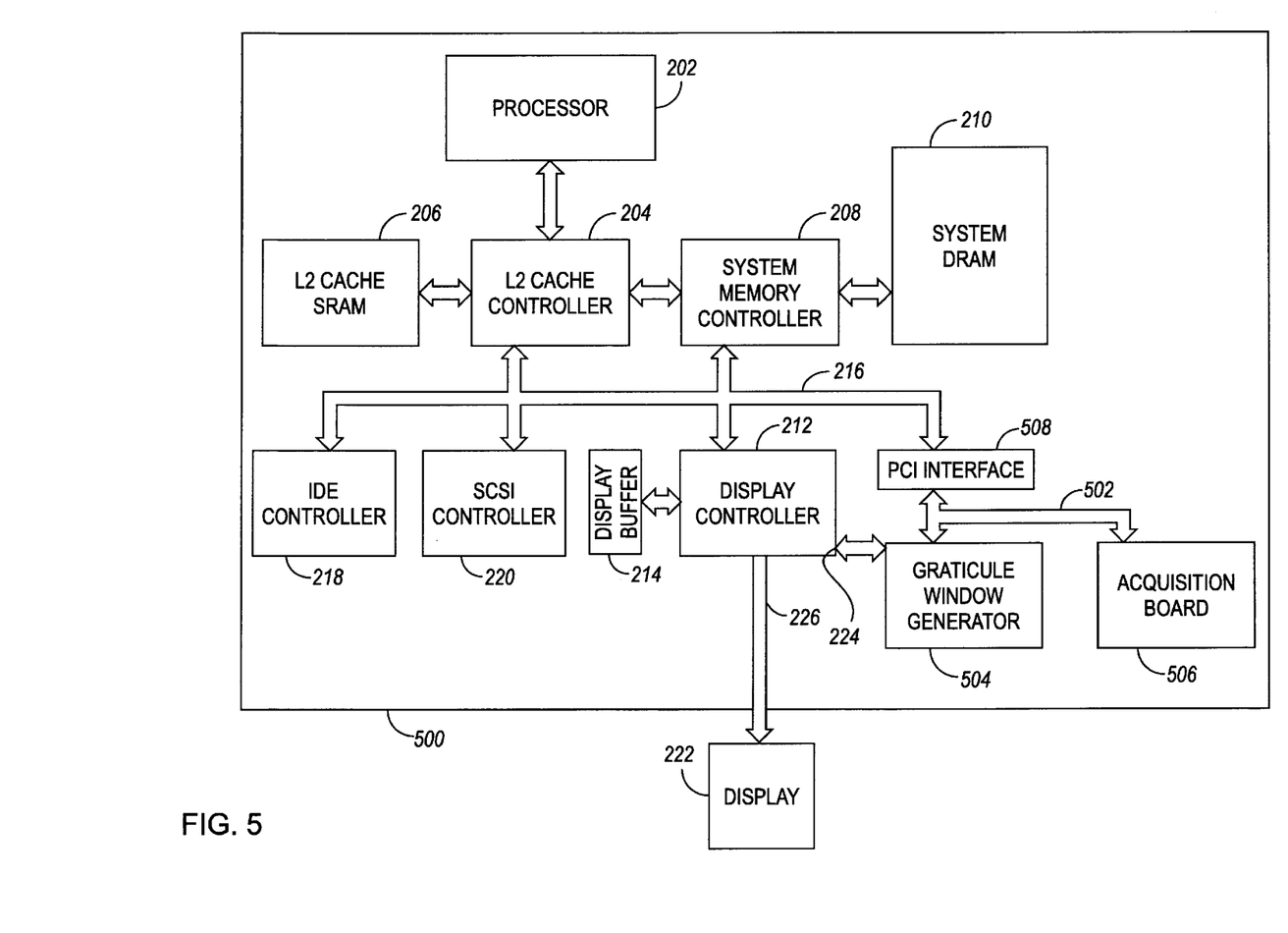
FIG. 5 is a schematic illustrating various components of the FIG. 4 waveform instrument.

Within the instrument 400 of FIG. 4 is a waveform acquisition board 506. The computerized waveform instrument 400 has a liquid crystal display (LCD) 402 and one or more media drives (such as a floppy disk drive, tape drive, etc.) 404 mounted therein. The acquisition board 506 has one or more spigots attached thereto. Cables or leads 406, 408 can be attached to the spigots, and connected to a device under test 410 from which waveform data is to be gathered.

The internal components 500 of the waveform instrument 500 (illustrated in FIG. 5) appear much the same as those shown in FIG. 2. However, note the addition of the graticule window generator 504. In general, the graticule window generator 504 is connected to the system bus 216 via a PCI interface 502, 508 (as is the acquisition board 506). Data obtained by the acquisition board 506 is stored in the graticule window generator 504, converted to video data 622, and then transmitted to the display controller 212 via its video port 224. In a preferred implementation of the invention, data output from the acquisition board consists of a y-value for each x-location of a display. In such an arrangement, it is necessary that data be preprocessed by the computer 500 prior to being input into the graticule window generator 504. In a nutshell, the preprocessing allows y-values to be converted into y-locations (using methods known in the art).

Figure 6:
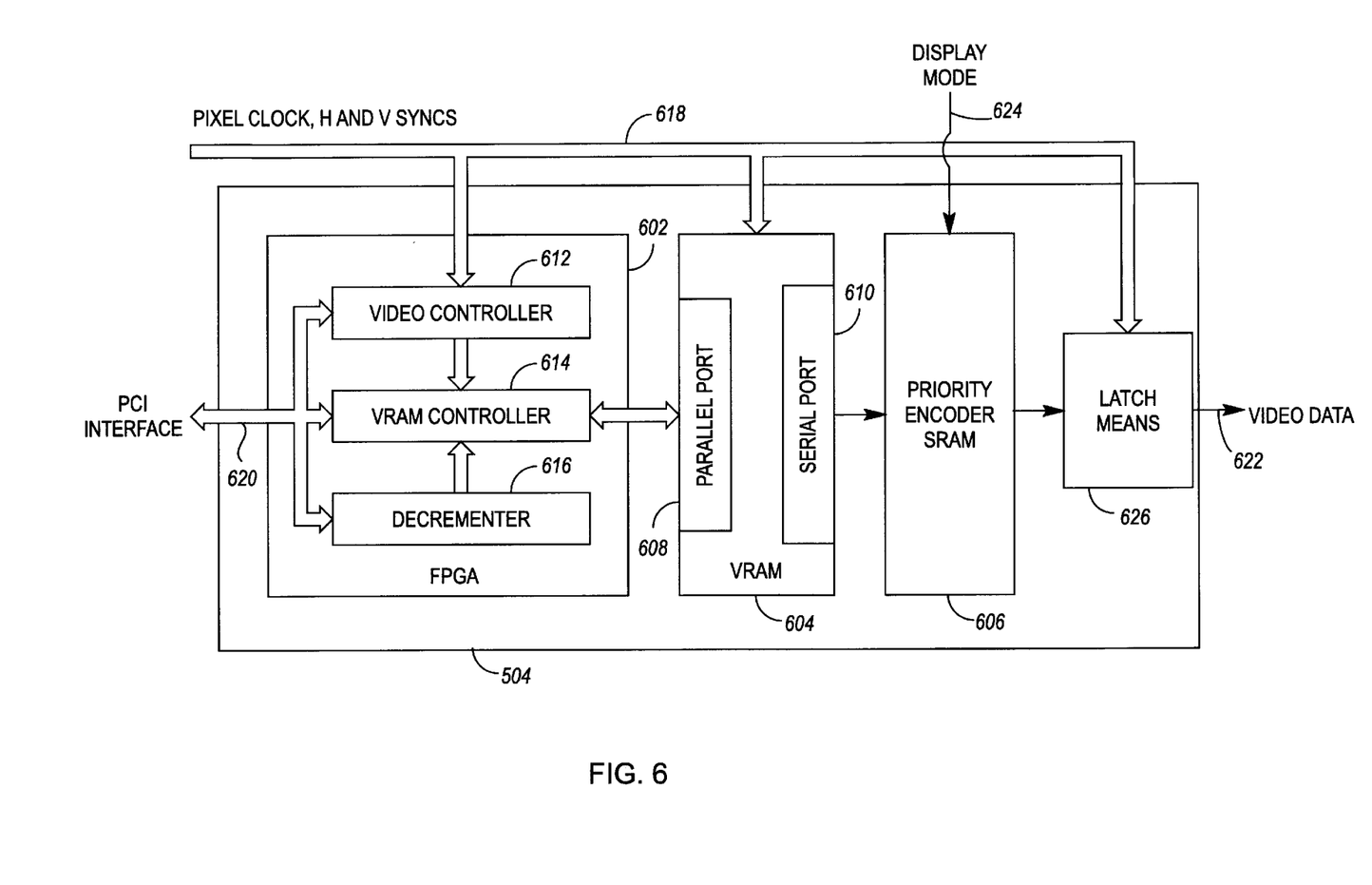
FIG. 6 is a schematic of the graticule window generator of FIG. 5.

A preferred embodiment of the graticule window generator 504 is shown in FIG. 6. Note that in this embodiment, the acquisition board 408 is connected to the PCI bus 216, and the graticule window generator 504 receives graticule window data via the PCI bus 216. However, an alternate arrangement contemplated by the inventor provides a direct connection between the acquisition board 408 and the graticule window generator 504. This alternate arrangement is advantageous in that PCI bus bandwidth is preserved for non-video transactions. The PCI bus arrangement is advantageous in that a PCI interface is well understood in the computer industry.

The graticule window generator 504 is envisioned to be in the form of an expansion card, which 1) can be plugged into an existing computer 200, and 2) is configured to interface with off-the-shelf computer components (e.g., display controller 212, and PCI bus 216).

The graticule window generator 504 essentially comprises three elements, a field programmable gate array (FPGA) 602, a video random-access memory (VRAM; sometimes referred to herein as a "secondary display buffer") 604, and encoding means (such as a priority encoder SRAM or similarly functioning encoder) 606. The encoding means 606 may or may not be followed by a latch means 626 which temporarily preserves data output from the encoding means 606. Data obtained by the acquisition board 408 is written to the VRAM 604 by way of the FPGA 602. As will be described below, data written to VRAM 604 is optimized for easy updating, and is not in a readily displayable video format (e.g., RGB or index). When displayed, the graticule window data is output from the VRAM 604 and converted to an accepted video format 224 by the priority encoder SRAM 606.

The heart of the graticule window generator 504 is the VRAM 604. VRAM 604 is particularly suited to the storage of graticule window data. VRAM 604 has two ports—one parallel port 608, and one serial port 610. In use, the parallel port 608 accesses a DRAM which is arranged in 1024 columns and 512 rows. Pixel data for a screen resolution of 640×480 is therefore supported. The serial port 610 refreshes the screen. A special parallel port access cycle transfers a row of memory to the serial port 610.

A VRAM data mask can protect bits from being modified. This turns most plotting operations into simple write cycles instead of read-AND-OR-write cycles. A block write cycle writes a single value to four sequential pixels. Within the block write, the data mask can apply, and an address mask can protect any of the four pixels from being modified. This feature is especially useful for drawing horizontal lines, such as reference lines within a graticule window. A flash write cycle writes a single value to an entire row of memory. The data mask can also be used in the flash write cycle. This feature is useful in clearing entire planes of data and/or to swap between planes in a double or triple-buffered display mode.

The FPGA 602 comprises a video controller 612, a VRAM controller 614, and a decrementer 616. The video controller 612 receives synchronization signals 618 such as horizontal and vertical syncs.

The VRAM controller 614 accepts and processes requests to talk to the VRAM 604.

The decrementer 616 functions as an accelerated display processor, and may be used to decrement and/or clear VRAM data, as will be described below. The decrementer 616 can also be used to efficiently draw filled rectangles of arbitrary dimensions, such as the horizontal and vertical lines of a graticule window.

Figure 7A:
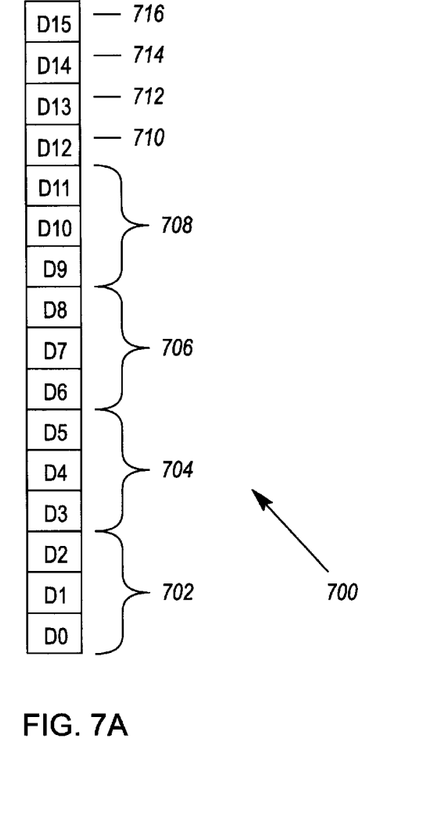
FIGS. 7A and 7B illustrate possible data formats for graticule window data stored in the video random-access memory of FIG. 6.

In a preferred embodiment of the invention, graticule window data 700 comprises sixteen bits arranged in eight fields 702–716. The various fields 702–716 are illustrated in FIG. 7A. The first four fields 702–708, each comprising three bits, control the display of up to four waveforms acquired from a device under test 410. An additional four 1-bit fields 710–716 control "markers", "memories", "graticule" and "highlight".

A 16-bit data field 700 as shown and described can be used to implement various display modes, including a "gray-scale variable persistence" mode, a "minimum persistence" mode, and an "infinite persistence" mode. Data is plotted in various planes so that any one or more of the planes may be plotted at a given moment in time.

The goal of gray-scale variable persistence mode is to provide a display which shows the history of waveforms. A user may be provided with control over the amount and duration of waveform history displayed. By allowing historical waveforms to "fade to black", a user can distinguish displayed traces based on their age. In a preferred variable persistence implementation, traces are always plotted at a full intensity setting of 7. Thus, all three of a waveform's bits are set (e.g., D0, D1, and D2). Waveform intensities are then decremented over time (i.e., the decrementer 616 periodically reduces the intensity of plotted pixels by performing read-modify-write operations on the VRAM 604). For example, settings 7 and 6 might correspond to full intensity, settings 5 through 1 might correspond to gradually decreasing intensities, and setting 0 might correspond to OFF. For long persistence times, the number of pixels decremented per screen refresh can be a small fraction of the total number of pixels. This helps to eliminate screen flicker by avoiding an instantaneous decrease in screen brightness. For short persistence times, several levels of intensity can be skipped (i.e., the decrementer 616 can decrement by 2, 3, 4, etc.).

Using the VRAM data mask, non-waveform bits 710–716 (e.g., D12–D15) can be protected as waveform data 702–708 is updated. Alternatively, waveform and non-waveform bits can be protected as only a single waveform or non-waveform field is updated.

The goal of minimum persistence mode is to provide a display which shows only the most recent traces of waveforms. Double or triple buffering may be required to eliminate flickering. Furthermore, LCD response times may require that traces from several acquisitions be plotted together. For example, two planes of data may be displayed for each waveform (e.g., D0 and D1) while data is being plotted into a third plane (e.g., D2). After data is plotted into the third plane, planes D1 and D2 might be displayed while data is being plotted into plane D0, and so on. In the preferred embodiment, the decrementer 616 performs up to 512 flash write cycles to clear newly inactive buffers. The VRAM data mask can be used to insure that only inactive buffers are written to.

Figure 7B:
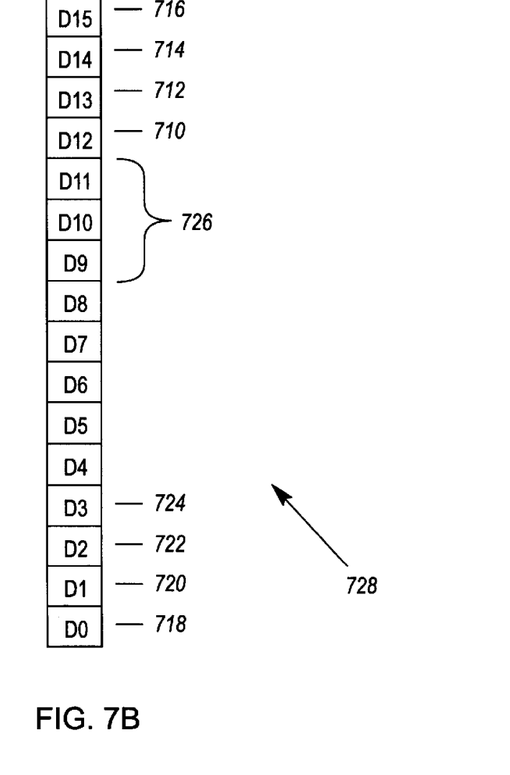

The goal of infinite persistence mode is to provide a display which shows an infinite amount of waveform history. In a preferred implementation, infinite persistence requires a slight modification to the fields 702–716 illustrated in FIG. 7A. In FIG. 7B, fields 718–726 replace fields 702–708. Fields 718–724 correspond to each of four displayed waveforms. Field 726 corresponds to the intensity of a displayed pixel. Once a waveform is plotted, pixels affected by the plotting remain illuminated. For example, if a waveform is plotted into bit D0, intensity bits D9–D11 are all set. Over time, bits D9–D11 are cleared (i.e., decremented) in succession, until at last, only bit D0 remains set. With any of bits D0–D3 set, a pixel remains illuminated at 50% intensity. If a waveform is again plotted into bit D0, or any of bits D1–D3, intensity bits D9–D11 are again set, and the decrementing of intensity bits D9–D11 is repeated. In this manner, only the most recently plotted waveforms are illuminated at full intensity, and all other plotted pixels are illuminated at 50% intensity.

A graticule window generator 504, which feeds data requiring a high update rate through a display controller's video port 224, is extremely useful in plotting live signal traces. To insure that an existing computer system is not bogged down by the addition of a graticule window generator 504, the generator is preferably unrecognizable to a computer's operating system. In other words, the generator 504 is controlled by application software alone, and is not recognized as a display device by a computer's operating system.

It is envisioned that the above method and apparatus may be used to display traces generated by all waveform instruments, whether modulation or frequency, electricity or light based (e.g., spectrum analyzers, oscilloscopes, network analyzers, lightwave oscilloscopes, modulation analyzers, and so on). Samples acquired at 1, 2 and 4 Gigasamples/second may now be displayed by a computerized waveform instrument.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A method of displaying live signal traces on a computer screen, comprising the steps of:
   a) writing graticule window data into a video random-access memory;
   b) writing conventional display data into a display buffer;
   c) in response to synchronization signals,
      i) reading the conventional display data;
      i) converting graticule window data stored in the video random-access memory into video data; and
      iii) in response to reading conventional display data which matches a reference color, multiplexing the video data with the conventional display data, thereby creating a video output; and d) illuminating pixels of a computer screen in response to the video output.

2. A method as in claim 1, wherein the graticule window data comprises signal trace data.

3. A method as in claim 2, wherein the graticule window data comprises signal trace data for multiple signal waveforms.

4. A method as in claim 2, wherein the graticule window data further comprises graticule line data.

5. A method as in claim 4, wherein the graticule window data further comprises marker and memory data.

6. A method as in claim 1, wherein:
a) graticule window data is written into various fields and planes of the video random-access memory; and
b) the step of converting graticule window data into video data depends upon selection of a mode variable, the mode variable being indicative of which fields and planes of graticule window data stored in the video random-access memory are to be converted into video data.

7. A method as in claim 1, further comprising the steps of:
a) generating a video random-access memory data mask; and
b) writing new graticule window data into unmasked bits of the video random-access memory, via write-only operations.

8. A method as in claim 1, wherein the video data, prior to being multiplexed with the conventional display data, is input through a video port of a display controller.

9. A method as in claim 1, further comprising the steps of, periodically:
a) generating a video random-access memory data mask;
b) reading unmasked bits of graticule window data from the video random-access memory;
c) decrementing the graticule window data read from the video random-access memory by a programmed amount; and
d) writing the decremented graticule window data back into the video random-access memory.

10. A method as in claim 1, further comprising the steps of, periodically:
a) generating a video random-access memory data mask; and
b) clearing unmasked bits of the video random-access memory by means of flash write operations.

11. A computer, configured to rapidly store, update and display graticule window data, comprising:
a) a display controller with a video port;
b) a display buffer, coupled to the display controller; and
c) a graticule window generator, connected to the video port;
wherein the display controller multiplexes data received from the display buffer and the graticule window generator so as to generate a video output; and
wherein the graticule window generator comprises:
i) video random-access memory;
ii) controller means for writing graticule window data into various bits and planes of the video random-access memory; and
iii) encoding means for converting various planes of graticule window data stored in the video random-access memory into video data.

12. A computer as in claim 11, wherein the display controller comprises:
a) a color comparator; and
b) a multiplexer;
wherein the color comparator receives data from the display buffer and compares same with a reference color; and
wherein the multiplexer receives first data signals from the display buffer, and second data signals from the encoding means, and multiplexes these first and second data signals in response to control signals output from the color comparator.

13. A computer as in claim 12, wherein:
a) a waveform data enable gate receives the control signals output from the color comparator, and also receives a video port enable signal; and
b) the multiplexer receives an output of the waveform data enable gate.

14. A computer as in claim 12, further comprising a system bus, wherein the display controller and graticule window generator are each coupled to the system bus.

15. A computer as in claim 14, further comprising a memory having an operating system stored therein, wherein the operating system recognizes the display controller as a display device, but does not recognize the graticule window generator as a display device.

16. A computer as in claim 11, wherein the graticule window generator comprises a field programmable gate array, and the controller means is an element thereof.

17. A computer as in claim 16, wherein the field programmable gate array further comprises a decrementer, wherein graticule window data read from the video random-access memory via the controller means may be modified by the decrementer, and written back into the video random-access memory.

18. A computer as in claim 11, wherein the format of the video data is RGB.

19. A computer as in claim 11, wherein the format of the video data is index.

20. A method of displaying data requiring a high update rate on a computer screen, comprising the steps of:
a) writing the data requiring the high update rate into a video random-access memory;
b) writing conventional display data into a display buffer;
c) in response to synchronization signals,
i) reading the conventional display data;
i) converting the data requiring the high update rate into video data; and
iii) in response to reading conventional display data which matches a reference color, multiplexing the video data with the data requiring the high update rate, thereby creating a video output; and
d) illuminating pixels of a computer screen in response to the video output.

* * * * *